United States Patent

Schmidt

[15] 3,660,156

[45] May 2, 1972

[54] SEMICONDUCTOR DOPING COMPOSITIONS

[72] Inventor: John George Schmidt, St. Louis, Mo.

[73] Assignee: Monsanto Company, St. Louis, Mo.

[22] Filed: Aug. 19, 1970

[21] Appl. No.: 65,358

[52] U.S. Cl. .................................. 117/201, 252/1, 148/189

[51] Int. Cl. .......................................................... HO1l 3/00

[58] Field of Search ........................ 117/201; 252/1; 148/189

[56] References Cited

UNITED STATES PATENTS 3,540,951 11/1970 Pammer et al. .................... 117/201 X

*Primary Examiner*—William L. Jarvis

*Attorney*—William I. Andress, John D. Upham and Neal E. Willis

[57] ABSTRACT

The disclosure herein relates to semiconductor doping compositions and to methods for their preparation and use. More particularly, the disclosure relates to liquid silica-based doping compositions which may be applied to a surface of a semiconductor substrate and, upon heating, an impurity is diffused from a film of the doping composition into the substrate to form a region therein having the desired electrical properties.

19 Claims, No Drawings

SEMICONDUCTOR DOPING COMPOSITIONS

BACKGROUND OF THE INVENTION

This invention pertains to the field of semiconductor doping compositions and methods for their preparation and use.

In the manufacture of semiconductor devices having designated areas therein of specific electrical conductivity, numerous procedures have been employed. Various of these procedures include epitaxial deposition, either by vapor phase or liquid phase techniques, to form films of the same or different semiconductor material upon a substrate. The epitaxial film usually contains a distribution of impurity atoms of a given type and/or concentration different from that of the substrate material. By use of photolithographic techniques, selected areas of the substrate or the epitaxial film may be masked from or exposed to further processing, including impurity diffusion and the deposition of additional expitaxial layers, passivation layers and/or contact metallization.

Pertinent to this invention are various methods for the diffusion of impurities into semiconductor materials. Prior art methods include impurity diffusions from a solid or vapor phase source into the whole surface or selected areas of the surface of a semiconductor substrate. However, these diffusions are, in general, unreliable, nonreproducible, give imprecise results and, in vapor phase diffusions, require elaborate gas distribution systems including valves, cocks, joints, etc.

Attempts have been made to circumvent the problems and generally unreliable results of solid and gas phase diffusions by means of liquid doping compositions, which include a variety of organic and inorganic slurries, mixtures and solutions which may be painted, sprayed, spun or centrifuged onto the semiconductor body, or into which the latter may be dipped. Among the liquid doping compositions described in the prior art are, e.g., colloidal dispersions of particulate silicon dioxide in a liquid medium containing dissolved doping materials (U.S. Pat. No. 3,514,348); liquid polymers containing a homogeneous mixture of trimethoxyboroxine and methyl trimethoxysilane, or use of the boroxine compound alone (U.S. Pat. No. 3,084,079); and mixtures of ground glasses suspended with a heat-depolymerizable binder in a solvent (U.S. Pat. No. 2,794,846).

The use of liquid doping compositions has introduced numerous additional problems. For example, many of these liquids are incapable of producing thin films or films free of pin holes through which contaminants penetrate to degrade surface properties of the semiconductor. Even colloidal silica particles coated with an oxide of the dopant element are inadequate to produce continuous doping films which are smooth, uniform and free of pin holes. Other disadvantages of some prior art liquid doping compositions, include an inhomogeneous distribution of the dopant agent or the need for dispersing agents or binding agents to keep the solid material in suspension. Still another disadvantage of at least one prior art liquid doping composition is the need to oxidize a liquid organic polymer to release the dopant from the polymer. The organic radicals, at diffusion temperatures, are thermally decomposed, thus resulting in organic residues in the doping layer. A further limitation on some liquid doping compositions is the reactivity of the components thereof, e.g., alkali metals, free water, etc., with the semiconductor substrate, resulting in problems such as nonadherence of the doping film, surface degradation and imperfections, irregular diffusion profiles, low yields and degradation of electrical properties. A particularly troublesome characteristic of some prior art doping compositions is the tendency to get and/or solidify rapidly, resulting in a short shelf life and requiring use within a few hours or a few days after preparation.

SUMMARY OF THE INVENTION

The present invention relates to novel semiconductor doping compositions, method for their preparation and use in doping semiconductor bodies for use in a variety of electronic devices.

The doping compositions herein comprise colloidal dispersions of a solid copolymer of hydrated silica and a hydrated oxide of a dopant element homogeneously dispersed in an anhydrous polar solvent.

In its preferred embodiment, the process for producing the doping compositions of the invention involves the esterification of an organic acid with the respective esters of silicon and the doping element in an anhydrous polar solvent in the presence of an esterification catalyst. In addition to the formation of an organic ester, the esterification results in the production of fully hydrated oxides of silicon and the dopant element. Reaction between the hydrated oxides results in partial intermolecular dehydration thereof and formation of colloidal particles of a solid copolymer of hydrated silica and the hydrated dopant oxide homogeneously dispersed in the solvent.

In broader aspect, the doping compositions of this invention may be prepared by the esterification of esterifiable compounds of silicon and a dopant element and the in situ use of such esters to esterify organic acids and form fully hydrated oxides of silicon and the dopant element. Copolymerization of the hydrated oxides occurs through partial intermolecular dehydration to form a homogeneous colloidal dispersion of a solid copolymer of hydrated silica and hydrated oxide of the dopant element in an anhydrous polar solvent.

The semiconductor doping compositions of the invention are applied to form a film upon the desired surface of the semiconductor to be treated, and upon heating to elevated temperatures volatile constituents are removed and, at diffusion temperatures, dopant atoms are diffused from the film uniformly into the semiconductor to the desired depth and in the desired concentration.

It is a significant advantage of the present invention that the above-described process provides maximum mixing and distribution of the silicon and dopant atoms within the copolymeric network of the semiconductor doping compositions and diffusion films of the invention. By virtue of the uniform distribution of silicon and dopant atoms, the latter is uniformly diffused from the film into the semiconductor.

In addition, the novel structure of the solid copolymer of hydrated oxides of silicon and the dopant atom homogeneously dispersed in an anhydrous polar solvent provides for the application of adherent films which are continuous, uniform and free of pin holes.

The extreme simplicity and efficacy of application of the films of this invention is shown by the fact that a very small quantity, e.g., one to three drops, of the doping composition can be placed on a stationary semiconductor wafer and then momentarily spun rapidly to distribute the doping composition uniformly over the surface of the wafer; only one such application of doping solution and one such momentary spinning is all that is required to apply the film of doping composition. This contrasts with a prior art method which requires the sequential application of several drops of a doping composition to the surface of a spinning wafer, each drop being spun dry before the next is applied, to build up a stratified succession of layers of the diffusion film.

Still another advantage of the present invention is the provision of semiconductor doping compositions which require no organic binders to suspend the solid components of the composition and, further, which have no organic groups which must be thermally decomposed by oxidation to release the dopant atoms and introduce possible residual organic contaminants.

It is, therefore, an object of the present invention to provide new and improved semiconductor doping compositions, method for their preparation and application.

It is another object of this invention to provide a doping film which is free of pin holes, inhomogeneous impurity distribution and deleterious components such as alkali metals, free water, organic residues, etc.

Still another object of this invention is the provision of a long shelf life semiconductor doping composition in which the dopant atoms are uniformly dispersed and can be diffused from an adherent film of the composition into a semiconductor body in controlled quantities in reproducible manner.

Yet another object of this invention is the provision of a process for producing semiconductor doping compositions and diffusion films which is simple, economical and is useful in doping semiconductor bodies with high-yield results.

DESCRIPTION OF THE PREFERRED EMBODIMENTS

In accordance with the preferred embodiment of this invention, semiconductor doping compositions are prepared by the esterification of an organic acid with the respective esters of silicon and the dopant element in an anhydrous polar solvent in the presence of an esterification catalyst to form an ester of the organic acid and the fully hydrated oxides of silicon and the dopant atom. The hydrated oxides immediately begin to copolymerize through partial intermolecular dehydration to form a homogeneous colloidal dispersion of solid copolymer of hydrated silica and hydrated oxide of the dopant element in the polar solvent.

EXAMPLE 1

This example illustrates the preparation and use of a semiconductor doping composition containing boron as the dopant.

Three and one-half grams of triethylborate, $B(OC_2H_5)_3$, are dissolved in 33 grams of absolute ethanol as a first solution; 12 grams of tetraethylorthosilicate, $Si(OC_2H_5)_4$, are dissolved in 33 grams of absolute ethanol as a second solution and 0.05 gram of titanium tetrachloride, $TiCl_4$, are dissolved in 33 grams of absolute ethanol as a third (catalyst) solution. The three solutions are then mixed together, preferably in a container sealed against moisture. 18.3 grams of acetic acid are then added to the solutions mixture.

The above mixture is then ready for immediate application as a film to a semiconductor body. However, it is preferable to allow the mixture to set for 1 to 2 days to permit copolymerization of the hydrated oxides of silicon and boron. This hydrated binary oxide doping composition is sufficiently stable that it may be stored for months prior to use.

The doping composition prepared according to the embodiment of this example is used to diffuse boron into a semiconductor wafer, such as silicon, of N-type conductivity to form therein a region of P-type conductivity. A wafer of N-type silicon 1¼ inches in diameter and doped with arsenic to a carrier concentration of about $2.5 \times 10^{17}$ atoms/cc is prepared for the diffusion by conventional means of lapping and polishing. The wafer is placed on a spinner and, while stationary, a small quantity, e.g., about two drops, of the doping composition is placed in the center of the wafer. The wafer is then spun at approximately 6,800 rpm, immediately covering the entire surface of the wafer with a single, continuous layer about 1,000 A thick.

After the doping composition has been applied to the silicon wafer it is placed in a diffusion furnace and heated to a first elevated temperature, e.g., 350° C, sufficiently high to vaporize any volatile components which remain after the high-speed spinning operation, including the solvent, and bound water of hydration, and leave a cohesive, adherent film comprised of a copolymer of the dehydrated oxides of silicon and boron. The film thus formed is characterized by a uniform network of repeating Si-O-B, Si-O-Si and B-O-B units homogeneously dispersed in the binary oxide with the percentage of Si-O-B and Si-O-Si units being maximized by the simultaneous in situ formation of the respective hydroxides. The silicon and boron atoms are present preferably in a ratio of at least 1 to 1 and have only oxygen atoms attached thereto.

Following the initial heating to drive off any volatile components, the silicon wafer coated with doping film is then further heated at diffusion temperatures of about 1,150° C for about 1 hour during which time boron diffuses from the binary oxide network into the silicon wafer to form a surface layer of *p*-type conductivity about $2.0\mu$ thick and having a surface concentration of approximately $2.8 \times 10^{19}$ atoms/cc.

With further regard to the spun-on film thickness, hence, the total available quantity of dopant atoms, the thickness can be varied by changing the ratio of copolymer to solvent in the original reaction mixture or by subsequent dilution prior to use. Alternatively, the ratio of dopant atoms to silicon atoms in the original mixture can be varied.

The partial solvation of the copolymer hydrate effects dispersion stability and homogeneity, which results in superior properties as a doping composition and allows a single application to be sufficient and maximum. Subsequent applications will not increase the total film thickness, unless the wafer is heated between applications to a sufficiently high temperature to drive off bound water of hydration and convert the copolymer hydrate to a dehydrated binary oxide. In contradistinction, an analogous operation performed in the prior art referenced above (U.S. Pat. No. 3,514,348) involves placing a drop of a doping liquid on a wafer spinning at 2,500 rpm to form and dry a first layer of a doping film and repeating this operation sequentially on the spinning wafer with a series of drops to build up successive layers in the diffusion coating.

EXAMPLE 2

This example illustrates the preparation and use of doping composition containing arsenic as the dopant.

In a first container tetraethoxysilane (tetraethylorthosilicate), $Si(OC_2H_5)_4$, in the amount of 11.9 grams was dissolved in 22.6 grams (28.6 ml) of absolute ethanol. After solution was complete, 16.16 grams (15.4 ml) of glacial acetic acid were added and the mixture sealed in a container for setting at least 1 hour prior to use.

In a second container, 3.7 grams of triethoxyarsine, $As(OC_2H_5)_3$, was dissolved in 41.4 grams (52.5 ml) of absolute ethanol. After solution was complete, 0.05 gram (0.03 ml) of $TiCl_4$ were added and this mixture sealed to set for at least an hour. Thereafter, equal volumes of the mixtures in the two containers were mixed together and allowed to react. After completion of the reaction, the doping composition may be used immediately, or stored for later use.

The colloidal dispersion of hydrated oxides of silicon and arsenic in ethanol can be used to form a diffusion film similarly as in the preceding example.

EXAMPLE 3

In the embodiment of this example, 10.21 grams (10.94 ml) of $Si(OC_2H_5)_4$ were dissolved in 27.38 grams (34.7 ml) of absolute ethanol. Upon completion of the solvation 12.94 grams (12.33 ml) of glacial acetic acid were added and the container sealed for later mixing with the dopant solution. In this case, a doping solution was prepared consisting of 5.44 grams(2.33 ml) of antimony pentachloride, $SbCl_5$, dissolved in 44 grams (55.7 ml) of absolute ethanol.

Both solutions were allowed to set for at least an hour, then equal volumes of each mixed together and allowed to react and form a copolymer of hydrated oxides of silicon and antimony homogeneously dispersed in ethanol. This doping composition may be used immediately or stored for later use as described in the preceding embodiments.

In this embodiment, the in situ formation of the ester of antimony generates by-product HCl which serves as the esterification catalyst.

EXAMPLE 4

In this example is described an embodiment for the preparation and use of a semiconductor doping composition containing zinc as the dopant.

In a first container 35 ml of glacial acetic acid are mixed with 200 ml of absolute ethanol followed by the addition of about 10 grams zinc acetate, $Zn(O_2C_2H_3)_2$ and 35 ml of $Si(OC_2H_5b4$. In a second container 0.3 gram of anhydrous aluminum chloride, $AlCl_3$, is mixed with 20 ml of anhydrous ethanol.

The two solutions are then mixed and sealed for a reaction period, at least 24 hours. Thereafter, the colloidal dispersion of the copolymer of the hydrated oxides of silicon and zinc may be used to form a diffusion film on a III–V compound semiconductor such as gallium arsenide, GaAs.

The doping composition is spun onto a wafer of N-type GaAs in the manner described above. Due to bound water of hydration in the copolymeric oxide of the spun-on film and the reactivity of GaAs with oxygen, a low temperature, e.g., less than 300° C, vacuum ($10^{-6}$ torr) extraction of the bound water is employed prior to diffusion. An alternative modification is to coat the GaAs wafer with a layer of silica, e.g., 500–1,000 A thick, prior to the spin-on operation. Thereafter, the GaAs wafer is heated to 875° C for about 1 hour to diffuse zinc into the wafer and form a surface layer of P-type conductivity about 5$\mu$ deep.

In a manner similar to that described in the foregoing embodiments, doping compositions comprising colloidal dispersions of copolymers of hydrated oxides of silicon and other dopant elements are suitably prepared and useful for doping a variety of semiconductor materials. Exemplary other semiconductor materials include III–V compounds, i.e., the nitrides, phosphides, arsenides and antimonides of boron, aluminum, gallium and mixtures thereof; II–VI compounds, i.e., the sulfides, selenides and tellurides of beryllium, zinc, cadmium and mercury and mixtures thereof; I–VII compounds having the cubic zinc blend structure such as the bromides, chlorides, iodides and fluorides of copper, silver, gold, sodium, lithium, rubidium and cesium; and Group IV elements, e.g., germanium and alloys thereof with silicon.

Suitable impurities for the doping compositions of this invention include those commonly known to and used in the art as acceptors, donors and traps to obtain the desired electrical conductivity. For example, suitable dopants for the III–V compounds include elements in Group II of the periodic system, e.g., zinc, cadmium, mercury to obtain P-type conductivity; and elements from Groups IV and VI such as germanium, tin, lead, sulfur, selenium and tellurium to obtain N-type conductivity. Suitable dopants for semiconductor elements from Group IV and their alloys include elements from Groups III and V, such as boron, aluminum, gallium, indium, arsenic, phosphorus and antimony. Suitable dopants for the II–VI compounds include elements from Groups I and V of the periodic system to produce P-type conductivity and elements from Group III to produce N-type conductivity.

It will be appreciated by those skilled in the art that where certain dopants have unique pecularities in some semiconductors, necessary adjustments in diffusion conditions will have to be made. For example, gold diffuses rapidly in silicon by interstitial diffusion, hence a shorter time and lower temperature is required, than with, e.g., arsenic which diffuses very slowly by a substitutional mechanism in silicon.

As indicated above, the doping impurities are incorporated together with the silicon, into the copolymeric hydrated oxides via partial intermolecular dehydration of the hydrated oxides of silicon and the dopant element. Preferably, the hydrated oxides of silicon and the dopant element are formed in situ by the esterification of an organic acid with the respective esters of silicon and the dopant element.

The process of the present invention, in broad purview, contemplates the preparation of the semiconductor doping compositions herein by the esterification of esterifiable compounds of silicon and a dopant element and the in situ use of such esters to esterify organic acids and form fully hydrated oxides of silicon and the dopant element which copolymerize through partial intermolecular dehydration to form a homogeneous colloidal dispersion of a solid copolymer of hydrated silica and hydrated oxide of the dopant element in an anhydrous polar solvent.

Illustrative esterifiable starting materials within the broad purview of this invention for producing the hydrated oxides of both silicon and the dopant element, include oxides, halides, hydrides, acylates, hydrocarbylates and alkoxides of silicon and the dopant element. As used herein an alkoxide includes the alcoholates, (i.e., esters of organic alcohols and inorganic acids), and esters of organic acids and non-metal hydroxides (also defined in the literature as salts or organic acids). The hydrocarbyl moieties referred to herein include alkyl and aryl radicals, and are exemplified preferably by lower alkyls having one to six carbon atoms and the phenyl radical With respect to the anhydrous solvents useful herein, the principal characteristics are that the solvent must be capable of dissolving all initial reactants; should be a polar solvent capable of stabilizing a charged colloidal suspension and relatively volatile at room temperature without decomposition. Exemplary solvents suitable for use herein include alcohols, ethers, esters, ketones and mixtures thereof. Preferred solvents include acetone and lower alkanols, e.g., methanol, ethanol, isopropanol and esters such as ethyl acetate.

As used herein the term "anhydrous" refers to the absence of any water other than water of hydration, a large part of which, if not most, is believed to be associated with the colloidally dispersed copolymer of the hydrated oxides of silicon and the dopant atom. The solvent as initially used should be water free.

With further respect to the esterification catalyst, a Lewis Acid catalyst is used. The catalyst can be added separately or it may be generated internally, e.g., where hydrogen chloride is a by-product of reaction. Suitable catalysts include mineral acids, aluminum and titanium halides and alkyls, e.g., $AlCl_3$, $TiCl_4$, triethylaluminum, triisopropylaluminum, tetraethyltitanium, tetraisopropyltitanium and the like.

With respect to the organic acids used herein, preferred acids include the lower alkanoic acids having from two to six carbon atoms.

The doping compositions of the present invention are eminently suitable for use in the fabrication of a wide spectrum of electronic devices. Small or large surface areas of semiconductor substrates may be processed by conventional techniques of photolithography, masking, etching, diffusion, etc., to form regions in the semiconductor having the desired electrical conductivity. By suitable selection of the appropriate doping impurity, one can fabricate any desired semiconductor structure, e.g., for junction devices utilizing P/N, N/P, N/P/N, P/N/P, P/I/N, N+/N/N+, P+/N/N+ or other desired structures. A further example of devices of commercial interest are those utilizing the buried layer or sub-diffused structure where a thin region of specified electrical conductivity is formed within a substrate of semiconductor material of different electrical conductivity and an epitaxial layer then deposited over the surface of the semiconductor. Other applications for the semiconductor doping compositions of this invention are found in the fabrication of light-emitting diodes, transistors, rectifiers, microwave devices and others too numerous to mention.

Various other modifications of this invention will occur to those skilled in the art without departing from the spirit and scope thereof.

I claim:

1. A semiconductor silica-based doping composition comprising a colloidal suspension of a solid copolymer of hydrated oxides comprising hydrated silica and at least one hydrated oxide of a dopant element homogeneously dispersed in an anhydrous polar solvent.

2. Composition according to claim 1 wherein the silicon and dopant atoms in said copolymer are present in a ratio of at least one silicon atom to one dopant atom.

3. Composition according to claim 2 wherein said silicon and dopant atoms have only oxygen atoms attached thereto.

4. Composition according to claim 3 wherein said dopant atoms are selected from the group consisting of acceptors, donors and traps.

5. Composition according to claim 4 wherein said acceptors are selected from the group consisting of Group V elements.

6. Composition according to claim 5 wherein the Group V element is selected from the group consisting of phosphorus, arsenic and antimony.

7. Composition according to claim 4 wherein said donors are selected from the group consisting of Group III elements.

8. Composition according to claim 7 wherein the Group III element is selected from the group consisting of boron, aluminum, gallium and indium.

9. Process for the preparation of a colloidal suspension of a solid copolymer of hydrated oxides comprising hydrated silica and at least one hydrated oxide of a dopant element homogeneously dispersed in an anhydrous polar solvent which comprises reacting silicon tetrahydroxide with a hydroxide of said dopant element in said solvent.

10. Process according to claim 9 wherein said silicon tetrahydroxide and said hydroxide of a dopant element are prepared by esterifying an estrifiable silicon compound and an esterifiable compound of said dopant element and reacting the formed esters with an organic acid in an anhydrous polar solvent.

11. Process according to claim 10 wherein said silicon compound is selected from the group consisting of halides, hydrides, alkoxides and alkyl and aryl esters of silicon; said compound of a dopant element is selected from the group consisting of halides, hydrides, oxides, alkoxides, esters and alkyl and aryl derivatives of the dopant element.

12. Process according to claim 10 wherein the esterification of the organic acid by the formed esters is carried out in the presence of a Lewis acid catalyst.

13. Process according to claim 9 wherein said silicon tetrahydroxide and said hydroxide of a dopant element are prepared by esterification of an organic acid with esters of silicon and the dopant element in the presence of an esterification catalyst.

14. Process according to claim 13 wherein said silicon compound is a tetrahydrocarbyloxysilane; said compound of a dopant element is selected from the group consisting of the hydrocarbyloxy derivatives of arsenic, boron, phosphorus and antimony; said polar solvent is an alcohol and said catalyst is selected from the group consisting of metal halides, metal alkyls and mineral acids.

15. Process according to claim 14 wherein the silicon compound is tetraethoxysilane; the compound of a dopant element is triethoxyarsine; the polar solvent is ethanol; the carboxylic acid is acetic acid and the catalyst is titanium tetrachloride.

16. Process for doping semiconductor materials which comprises:

a. applying to the surface of said semiconductor a film of a doping solution comprising a colloidal suspension of a solid copolymer of hydrated oxides comprising hydrated silica and at least one hydrated oxide of a dopant element homogeneously dispersed in an anhydrous polar solvent;
b. evaporation said solvent from the said film and
c. heating the filmed semiconductor to drive off water and leave a dehydrated copolymer of said oxides from which the dopant element is diffused into said semiconductor at sufficiently high temperature.

17. Process according to claim 16 wherein said semiconductor materials are selected from the group consisting of silicon, germanium, and mixtures thereof, I–VII, II–VI and III–V compounds and mixtures thereof.

18. Process according to claim 16 wherein the silicon and dopant element in said copolymer have only oxygen atoms attached thereto.

19. Process according to claim 16 wherein the silicon-to-dopant element atomic ratio in said copolymer is at least one-to-one.

* * * * *